(12) United States Patent
Xu et al.

(10) Patent No.: US 12,563,917 B2
(45) Date of Patent: Feb. 24, 2026

(54) DISPLAY SUBSTRATE AND DISPLAY APPARATUS

(71) Applicant: BOE Technology Group Co., Ltd., Beijing (CN)

(72) Inventors: Pan Xu, Beijing (CN); Dacheng Zhang, Beijing (CN); Yicheng Lin, Beijing (CN); Yongqian Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 688 days.

(21) Appl. No.: 17/771,659

(22) PCT Filed: Jun. 15, 2021

(86) PCT No.: PCT/CN2021/100069
§ 371 (c)(1),
(2) Date: Apr. 25, 2022

(87) PCT Pub. No.: WO2021/254319
PCT Pub. Date: Dec. 23, 2021

(65) Prior Publication Data
US 2022/0384558 A1     Dec. 1, 2022

(30) Foreign Application Priority Data
Jun. 18, 2020   (CN) .......................... 202010560547.2

(51) Int. Cl.
*H10K 59/131*     (2023.01)

(52) U.S. Cl.
CPC .................................. *H10K 59/131* (2023.02)

(58) Field of Classification Search
CPC ................................................... H10K 59/131
See application file for complete search history.

(56) References Cited

U.S. PATENT DOCUMENTS

| | | |
|---|---|---|
| 2015/0001490 A1 | 1/2015 | Lee |
| 2018/0261657 A1* | 9/2018 | Kim ...................... H10K 59/131 |

(Continued)

FOREIGN PATENT DOCUMENTS

| | | |
|---|---|---|
| CN | 202120015 U | 1/2012 |
| CN | 104977740 A | 10/2015 |

(Continued)

OTHER PUBLICATIONS

First Office Action issued on Sep. 2, 2022 for application No. CN202010560547.2 with English translation attached.

*Primary Examiner* — Vongsavanh Sengdara
(74) *Attorney, Agent, or Firm* — Nath, Goldberg & Meyer; Joshua B. Goldberg

(57) ABSTRACT

The present disclosure provides a display substrate and a display apparatus. The display substrate has a display region, and the display substrate includes a base substrate and a plurality of gate lines and a plurality of data lines on the base substrate; the plurality of gate lines and the plurality of data lines are arranged to cross each other to define a plurality of pixel regions, and a pixel unit is arranged in a pixel region of the plurality of pixel regions; each pixel unit includes a thin-film transistor and a light-emitting device in the display region; the display substrate further comprises a plurality of fan-out traces in the display region, wherein each fan-out trace of the plurality of fan-out traces is electrically connected to a data line corresponding to the fan-out trace, and is arranged in a different layer from the date lines and the gate lines.

13 Claims, 5 Drawing Sheets

(56)     References Cited

U.S. PATENT DOCUMENTS

| | | | | |
|---|---|---|---|---|
| 2019/0272790 A1 * | 9/2019 | Chang | ................. | H10K 59/131 |
| 2020/0013848 A1 * | 1/2020 | Moon | ................. | H10K 59/131 |
| 2020/0202784 A1 * | 6/2020 | Kim | .................... | G09G 3/3233 |
| 2020/0310580 A1 * | 10/2020 | Han | ...................... | G06F 3/0414 |
| 2020/0312882 A1 * | 10/2020 | Son | ....................... | H10D 86/60 |

FOREIGN PATENT DOCUMENTS

| | | | |
|---|---|---|---|
| CN | 105739787 A | 7/2016 |
| CN | 107884994 A | 4/2018 |
| CN | 108336109 A | 7/2018 |
| CN | 108695370 A | 10/2018 |
| CN | 108732837 A | 11/2018 |
| CN | 108878444 A | 11/2018 |
| CN | 108878484 A | 11/2018 |
| CN | 108919578 A | 11/2018 |
| CN | 109037282 A | 12/2018 |
| CN | 109407436 A | 3/2019 |
| CN | 109541865 A | 3/2019 |
| CN | 109656067 A | 4/2019 |
| CN | 109671742 A | 4/2019 |
| CN | 109887972 A | 6/2019 |
| CN | 110032007 A | 7/2019 |
| CN | 110429088 A | 11/2019 |
| CN | 110931515 A | 3/2020 |
| CN | 111653603 A | 9/2020 |
| CN | 112310125 A | 2/2021 |
| IN | 110164949 A | 8/2019 |
| KR | 20140053626 A | 5/2014 |
| KR | 20180047536 A | 5/2018 |
| WO | 2018062023 A1 | 4/2018 |

* cited by examiner

DISPLAY SUBSTRATE AND DISPLAY APPARATUS

CROSS-REFERENCE TO RELATED APPLICATION

This is a National Phase Application filed under 35 U.S.C. 371 as a national stage of PCT/CN2021/100069 filed on Jun. 15, 2021, an application claiming the priority of the Chinese Patent Application No. 202010560547.2 filed on Jun. 18, 2020, the entire contents of which are incorporated herein by reference.

TECHNICAL FIELD

The present disclosure belongs to the field of display technology, and particularly, relates to a display substrate and a display apparatus.

BACKGROUND

As application scenarios for display panels are becoming more complex than ever before, display panels of regular shapes (hereinafter referred to as "regularly-shaped display panels") cannot meet users' needs any longer, and therefore, display panels of irregular shapes (hereinafter referred to as "irregularly-shaped display panels") are gaining increasing popularity among the users. In a currently available irregularly-shaped display panel, a layer of fan-out traces is typically arranged in a same layer as a film layer where source and drain electrodes of thin-film transistors in a display region are situated, and the fan-out traces are arranged at a side of a peripheral region surrounding the display region; as a result, the fan-out traces occupy a frame of the display panel.

Typically, there are only two metal layers in the display region, that is, a metal layer of gate electrodes and a metal layer of source and drain electrodes, and the fan-out traces must use these two metal layers; therefore, the fan-out traces of the currently available irregularly-shaped display panel can only be arranged in the peripheral region, which would enlarge the frame of the display panel. Moreover, for a high-resolution display panel of a large size, it is necessary to arrange more fan-out traces, which would further enlarge the frame of the display panel.

SUMMARY

The present disclosure provides a display substrate and a display apparatus.

The display substrate has a display region and includes a base substrate, and a plurality of gate lines and a plurality of data lines on the base substrate; the plurality of gate lines and the plurality of data lines are arranged to cross one another to define a plurality of pixel regions, and a plurality of pixel units are arranged in the plurality of pixel regions, respectively; and each pixel unit of the plurality of pixel units includes a thin-film transistor and a light-emitting device in the display region, wherein the display substrate further includes a plurality of fan-out traces in the display region; and each fan-out trace of the plurality of fan-out traces is electrically connected to a data line corresponding to the fan-out trace, and the plurality of fan-out traces, the plurality of data lines and the plurality of gate lines are situated in different layers.

In one embodiment, the display substrate further includes an interlayer insulation layer on a side of a layer where the plurality of data lines are situated away from the base substrate, wherein the plurality of fan-out traces are situated on a side of the interlayer insulation layer away from the plurality of data lines; and each fan-out trace of the plurality of fan-out traces is connected to a data line corresponding to the fan-out trace through a first via penetrating through the interlayer insulation layer.

In one embodiment, the display substrate further includes a bonding region on a first side of the display region, wherein the first via is arranged at an edge of a second side of the display region opposite to the first side.

In one embodiment, the data line and a source electrode and a drain electrode of the thin-film transistor are arranged in a same layer; and the display substrate further includes a passivation layer, a first planarization layer and a second planarization layer successively arranged on a side of the data line away from the base substrate, and a transfer electrode arranged between the first planarization layer and the second planarization layer, wherein the transfer electrode is connected to the drain electrode of the thin-film transistor through a second via penetrating through the passivation layer and the first planarization layer; a first electrode of the light-emitting device is connected to the transfer electrode through a third via penetrating through the second planarization layer; and the fan-out trace and the transfer electrode are insulated from each other, arranged in a same layer and made of a same material.

In one embodiment, each fan-out trace of the plurality of fan-out traces includes a first sub-connection line, a second sub-connection line and a third sub-connection line which are electrically connected in sequence, wherein a first end of a first sub-connection line of each fan-out trace of the plurality of fan-out traces is connected to a data line corresponding to the first sub-connection line, and a second end of the first sub-connection line is connected to a first end of a second sub-connection line corresponding to the first sub-connection line; a second end of the second sub-connection line is connected to a first end of a third sub-connection line corresponding to the second sub-connection line; respective first sub-connection lines of the plurality of fan-out traces are distal to the bonding region relative to respective second sub-connection lines of the plurality of fan-out traces; and a spacing between two adjacent third sub-connection lines, among respective third sub-connection lines of the plurality of fan-out traces, is smaller than a spacing between two adjacent first sub-connection lines.

In one embodiment, a direction along which the respective third sub-connection lines and/or the respective first sub-connection lines of the plurality of fan-out traces extend is identical to a direction along which the plurality of data lines extend.

In one embodiment, the respective first sub-connection lines of the plurality of fan-out traces are arranged side by side in a middle region in the display region.

In one embodiment, the light-emitting device in each pixel region includes an organic light-emitting diode which has a first electrode, a second electrode and an organic luminescent layer between the first electrode and the second electrode; the organic light-emitting diode is situated on a side of the plurality of fan-out traces distal to the base substrate; and the direction along which the respective third sub-connection lines of the plurality of fan-out traces extend is identical to the direction along which the plurality of data lines extend, each third sub-connection line is situated on a side of a data line corresponding to the third sub-connection line distal to the base substrate and is also situated on a side of an organic luminescent layer corresponding to the third sub-connection line close to the base substrate, and an orthographic projection of the third sub-connection line on the base substrate falls within a range of an orthographic projection of an organic light-emitting diode corresponding to the third sub-connection line on the base substrate.

In one embodiment, an included angle between the second sub-connection line and the first sub-connection line and/or an included angle between the second sub-connection line and the third sub-connection line range from 80 degrees to 100 degrees.

In one embodiment, the pixel unit further includes a storage capacitor; a first plate of the storage capacitor and the gate electrode of the thin-film transistor are arranged in a same layer and made of a same material; and a second plate of the storage capacitor and the source electrode and the drain electrode of the thin-film transistor are arranged in a same layer and made of a same material.

In one embodiment, the pixel unit further includes a storage capacitor; a first plate of the storage capacitor and the gate electrode of the thin-film transistor are arranged in a same layer and made of a same material; and a second plate of the storage capacitor and a metal layer arranged on a gate insulation layer on top of the gate electrode of the thin-film transistor are arranged in a same layer and made of a same material.

In one embodiment, the plurality of pixel units include a plurality of pixel units arranged in a plurality of rows and columns, and respective numbers of pixel units in at least some rows of pixel units among the plurality of pixel units arranged in the plurality of rows and columns are different from one another.

In one embodiment, numbers of pixel unites in the rows of pixel units decrease along a direction close to the bonding region.

The present disclosure further provides a display apparatus, including the display substrate as described above.

In one embodiment, the display apparatus further includes a driving chip; and the driving chip is situated on the side of the base substrate away from the plurality of pixel units and electrically connected to the plurality of fan-out traces in the bonding region.

DETAILED DESCRIPTION OF THE EXEMPLARY EMBODIMENTS

In order to enable a person skilled in the art to better understand the technical solutions of the present disclosure, a detailed description will hereinafter be given to the present disclosure with reference to the accompanying drawings and embodiments.

In a display substrate to be described below, a thin-film transistor may be any transistor in a pixel unit, and the related art and various embodiments of the present disclosure will be described using the example of the thin-film transistor being a driving transistor in the pixel unit. It is to be understood that a switching transistor or a writing transistor may also be structured and manufactured in the same manner as the driving transistor, and their description is therefore omitted herein. A light-emitting device may specifically be an organic electroluminescent diode or any other type of light-emitting device, and the related art and various embodiments of the present disclosure will be described using the example of the organic electroluminescent diode. The organic electroluminescent diode has a first electrode, a second electrode and a luminescent layer between the first electrode and the second electrode; and the first electrode is, for example, an anode of the organic electroluminescent diode, and the second electrode is, for example, a cathode thereof.

Figure 1A:
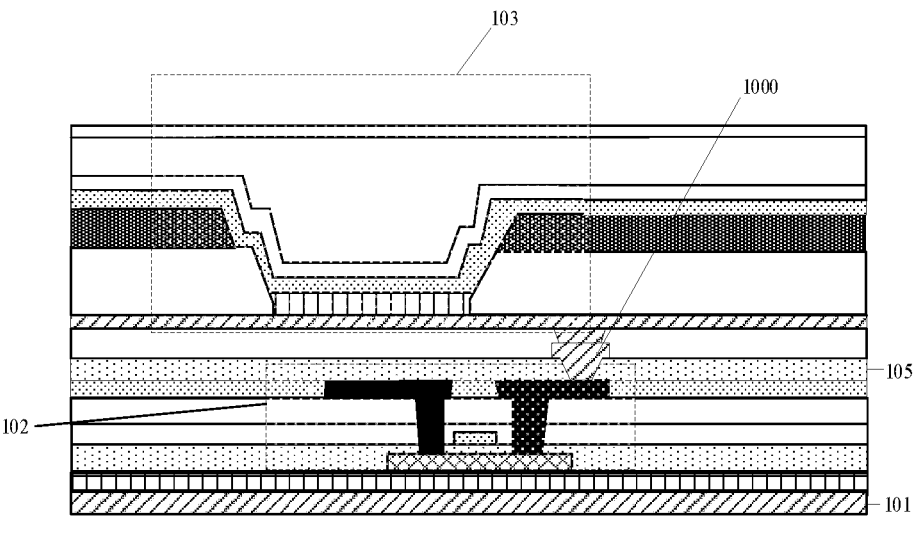
FIG. 1A is a cross-sectional view of a structure of a display substrate in the related art.
Figure 1B:
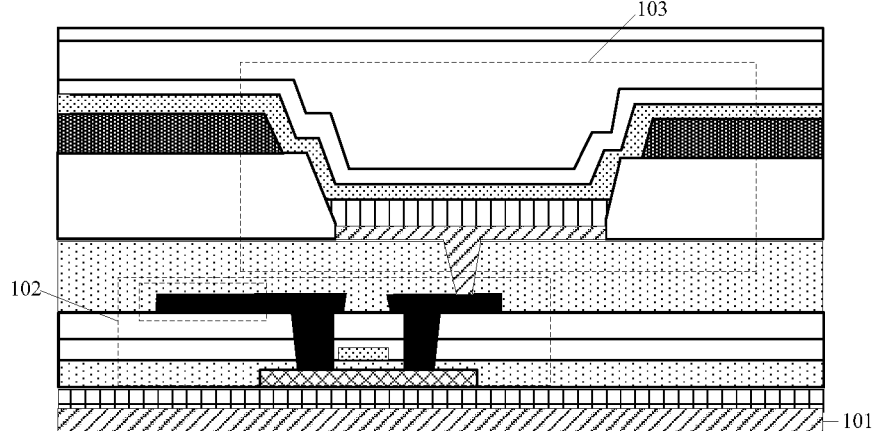
FIG. 1B is a cross-sectional view of a structure of a display substrate in the related art.
Figure 2A:
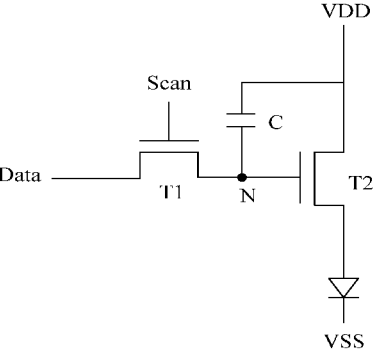
FIG. 2A is a schematic view of a structure of an exemplary pixel driving circuit.
Figure 2B:
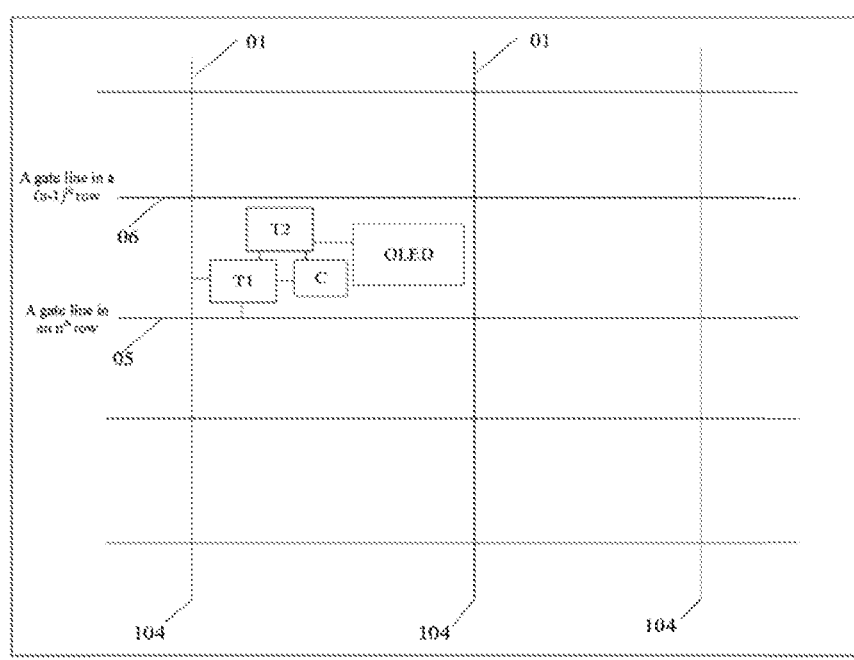
FIG. 2B is a schematic view of a structure of an exemplary display panel.
Figure 3:
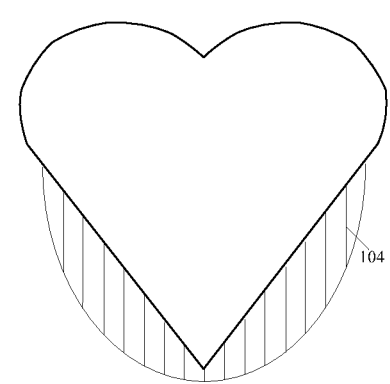
FIG. 3 is a plan view of a structure of a display substrate in the related art.

FIG. 1A is a cross-sectional view of a structure of a display substrate in the related art. As shown in FIG. 1A, the display substrate has a display region and a peripheral region surrounding the display region; the display substrate includes a base substrate 101, a plurality of gate lines 05 and 06 (as shown in FIG. 2B) and a plurality of data lines 01 on the base substrate 101 (a data line 01 and a source electrode of a thin-film transistor 102 may be made as a single piece; in a case where the thin-film transistor 102 is a switching transistor T1 as shown in FIG. 2, a portion of a source electrode of the switching transistor T1, that is, a portion enclosed by dashed lines in FIG. 1B, acts as the data line 01), and a plurality of fan-out traces 104 respectively connected to the plurality of data lines (as shown in FIG. 3); the plurality of gate lines and the plurality of data lines are arranged to cross one another, positions at which they cross one another define a plurality of pixel regions, and a pixel unit is arranged in each pixel region; each of the plurality of pixel units is provided with a pixel driving circuit which, as shown in FIGS. 2A and 2B, includes the switching transistor T1, a driving transistor T2, a storage capacitor C and an organic electroluminescent diode (also known as organic light-emitting diode (OLED) and hereinafter referred to as "organic electroluminescent diode D"), wherein a gate electrode of the switching transistor T1 is connected to a gate line Scan, a source electrode thereof is connected to a data line Data, a drain electrode thereof is connected to a first node N, and the first node N is a point at which the drain electrode of the switching transistor T1, the gate electrode of the driving transistor T2 and an end of the storage capacitor C are connected to one another. A gate electrode of the driving transistor T2 is connected to the first node N, a source electrode thereof is connected to a first power supply voltage terminal VDD, and a drain electrode thereof is connected to an anode of the organic electroluminescent diode D. The end of the storage capacitor C is connected to the first node N, and the other end thereof is connected to the first power supply voltage terminal VDD. The anode of the organic electroluminescent diode D is connected to the drain electrode of the driving transistor T2, and the cathode thereof is connected to a second power supply voltage terminal VSS. It is to be noted that a potential inputted into the first power supply voltage terminal VDD is greater than that inputted into the second power supply voltage terminal VSS. FIGS. 1A and 1B only show that each pixel unit includes a thin-film transistor 102 and a light-emitting device 103 in the display region, and that a drain electrode of the thin-film transistor 102 is connected to an anode of the light-emitting device 103. The thin-film transistor 102 shown in FIGS. 1A and 1B is the driving transistor T2 as described above; the switching transistor T1 may be structured and manufactured in the same manner as the driving transistor T2, and its description is therefore omitted herein. An external driving chip may be connected to the data line through a fan-out trace, provide a data signal to the light-emitting device 103 in the pixel unit, and cause the light-emitting device 103 to emit light when being driven by a voltage between the first power supply voltage terminal VDD and the second power supply voltage terminal VSS, thereby realizing a display function.

FIG. 1A differs from FIG. 1B in that the display substrate in FIG. 1A further includes an interlayer insulation layer 105 arranged on a side of a layer where the data line is situated (i.e., a layer where the source and drain electrodes are situated) away from the base substrate 101, and that the anode of the light-emitting device 103 is connected to the drain electrode of the thin-film transistor through a conductive material filling a second via 1000.

FIG. 3 is a plan view of a structure of a display substrate in the related art. As shown in FIG. 3, the display substrate is an irregularly-shaped display substrate, for example, a heart-shaped display substrate, and an inside of the heart shape is a display region, and an outside thereof is a peripheral region. Since in the related art, the respective layers where the gate electrodes and the source electrodes (or the drain electrodes) of the thin-film transistors 102 are situated are the only metal conductive layers in the display substrate, in a manufacturing process, the fan-out traces must be manufactured using these two metal conductive layers. As such, the fan-out traces 104 must be arranged in the peripheral region outside the heart shape, and edges of the fan-out traces 104 constitute an irregular shape, which very likely results in the fan-out traces 104 requiring a larger frame to accommodate them. Moreover, for a high-resolution display panel of a large size, it is necessary to arrange more fan-out traces 104, which would further enlarge the frame of the display panel. In order to solve the technical problem that in the related art, the fan-out traces 104 must be arranged in the peripheral region and therefore require a larger frame to accommodate them, embodiments of the present disclosure provide a display substrate and a display apparatus, a detailed description of which will hereinafter be given with reference to the accompanying drawings and exemplary embodiments.

Figure 4A:
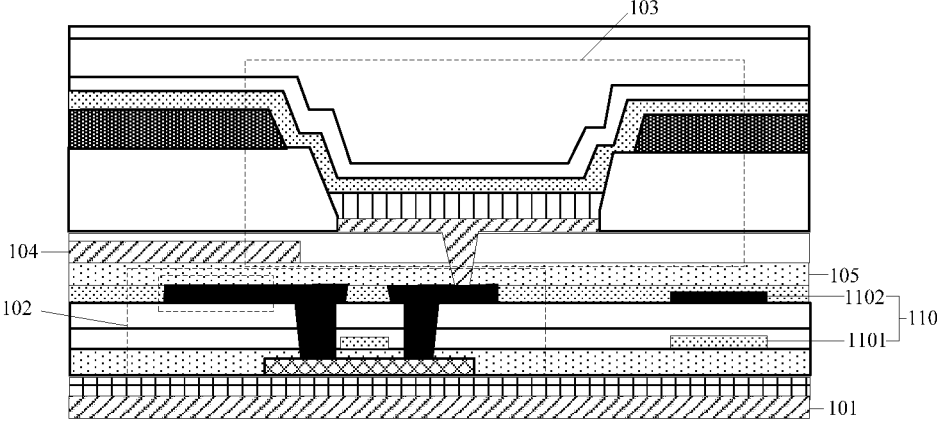
FIG. 4A is a cross-sectional view of a structure of a display substrate provided in some embodiments of the present disclosure.
Figure 5A:
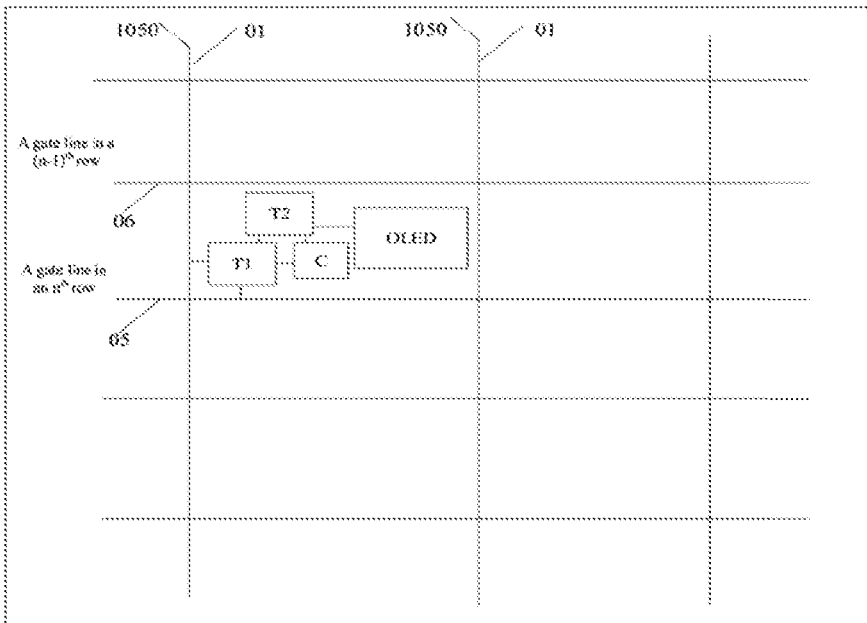
FIG. 5A is a schematic view of a structure of a display substrate provided in some embodiments of the present disclosure.
Figure 5B:
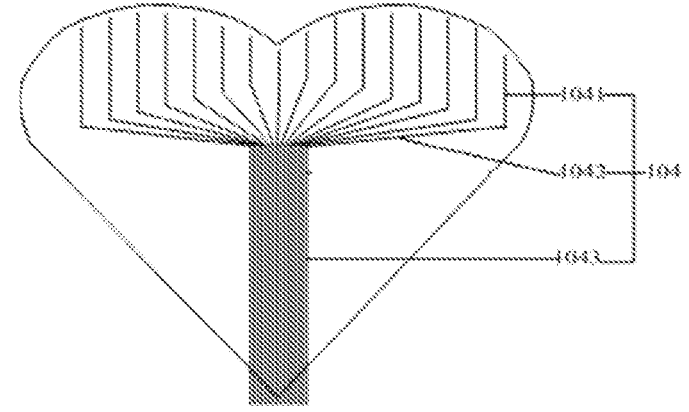
FIG. 5B is a plan view of a structure of a display substrate provided in some embodiments of the present disclosure.
Figure 5C:
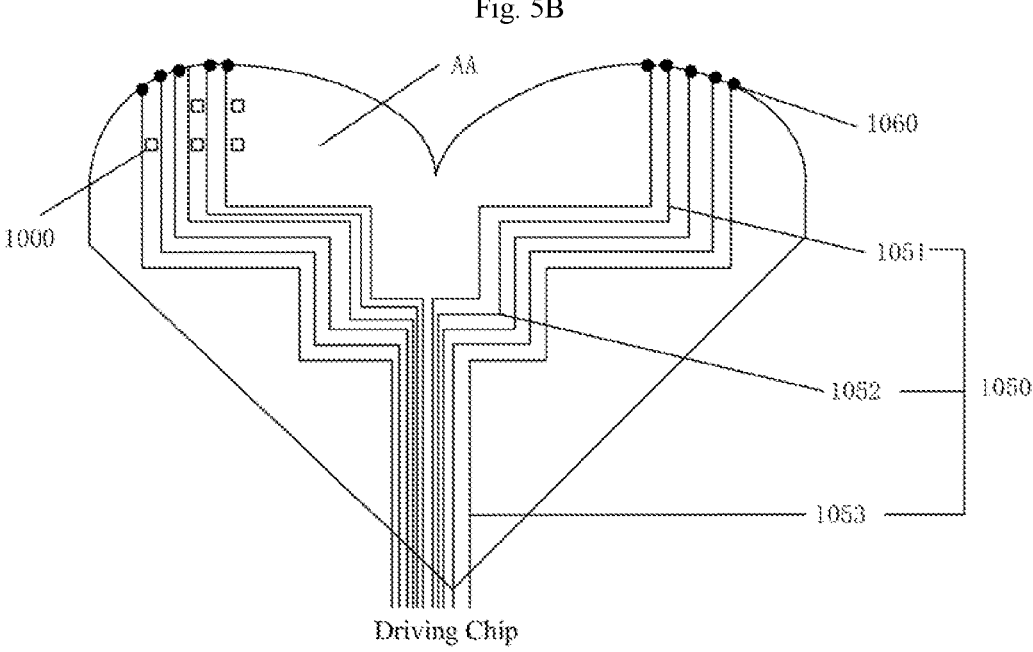
FIG. 5C is a plan view of a structure of a display substrate provided in some embodiments of the present disclosure.

FIG. 4A is a cross-sectional view of a structure of a display substrate provided in some embodiments of the present disclosure. As shown in FIG. 4A, the display substrate has a display region (a heart-shaped display region AA as shown in FIG. 5C), and includes a base substrate 101, a plurality of gate lines on the base substrate 101 (gate lines 05 and 06 as shown in FIG. 5A) and a plurality of data lines (data lines 01 shown in FIG. 5A, and each data line 01 and a source electrode of a corresponding thin-film transistor 102 being made as a single piece); the plurality of gate lines and the plurality of data lines are arranged to cross one another to define a plurality of pixel regions having a plurality of pixel units; each pixel unit of the plurality of pixel units includes a thin-film transistor 102 and a light-emitting device 103 in the display region; and the display substrate further includes a plurality of fan-out traces 104 in the display region, wherein the plurality of fan-out traces 104 are connected to the plurality of data lines corresponding thereto, and situated in a layer different from those of the plurality of data lines and the plurality of gate lines.

In the display substrate provided in the embodiments of the present disclosure, the fan-out traces 104 are situated in the display region of the display substrate and in a layer different from those of the data lines and the gate lines. Therefore, wiring of the fan-out traces 104 can be performed in an independent wiring layer to avoid the data lines and the gate lines, such that the wiring of the fan-out traces 104 is not restricted by these lines. As shown in FIGS. 5A to 5C, in the display region AA, the data lines may be drawn out by the fan-out traces 104, an area occupied by all the fan-out traces 104 may be controlled and reduced by controlling a spacing between adjacent fan-out traces 104 in the display region AA, such that the fan-out traces 104, when being drawn to an external driving chip, just need a relatively small frame (a region outside the heart shape as shown in FIG. 5C) of the display substrate to accommodate them, which can make the frame of the display substrate more compact, and therefore increase a screen-to-body ratio and improve display effects.

In some embodiments, as shown in FIG. 4A, an interlayer insulation layer 105 is arranged on a side of a layer where a data line is situated away from the base substrate 101; a fan-out trace 104 is situated on a side of the interlayer insulation layer 105 away from the data line; and the fan-out trace 104 is connected to the data line through a first via penetrating through the interlayer insulation layer 105.

Figure 4B:
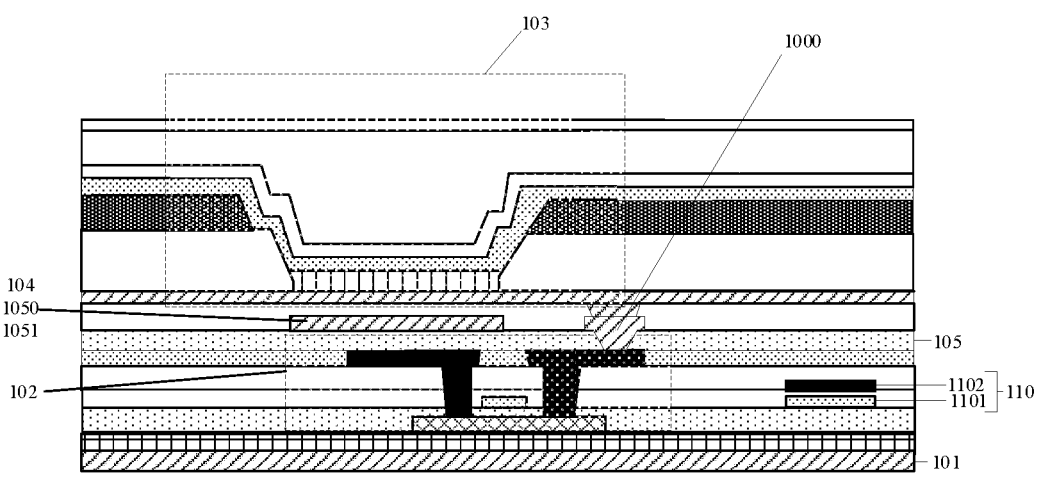
FIG. 4B is a cross-sectional view of a structure of a display substrate provided in some embodiments of the present disclosure.
Figure 4C:
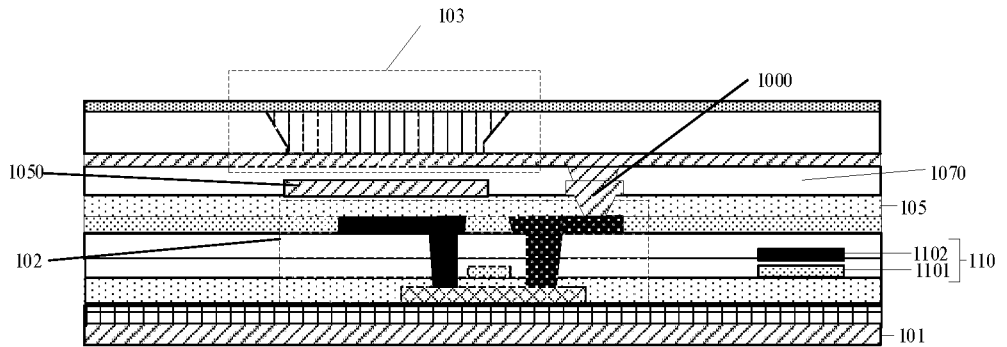
FIG. 4C is a cross-sectional view of a structure of a display substrate provided in some embodiments of the present disclosure.

In some embodiments, the data line is arranged in a same layer as a layer where the source and drain electrodes of the thin-film transistor 102 are situated, and the interlayer insulation layer 105 is arranged on the side of the layer where the data line is situated (i.e., the layer where the source and drain electrodes are situated) away from the base substrate 101; and a fan-out trace 1050 is arranged on a side of the interlayer insulation layer 105 away from the base substrate 101, an isolation layer 1070 which is flat is then arranged on the interlayer insulation layer 105 to cover the fan-out trace 1050 on the interlayer insulation layer 105, and an organic light-emitting diode 103, which includes an anode, an organic luminescent layer and a cathode, is arranged on the isolation layer 1070. While FIGS. 4B and 4C show two different structures of the organic light-emitting diode 103, the idea of the present disclosure can be applied to the organic light-emitting diode 103 with either structure. The anode of the organic light-emitting diode 103 is electrically connected to the drain electrode of the thin-film transistor 102 through the conductive material filling the second via 1000 in the interlayer insulation layer 105.

As shown in FIGS. 4B and 4C, in the pixel unit, the fan-out trace 1050 and the conductive material filling the second via 1000 are regarded as being arranged in a same layer. In other words, the fan-out trace 1050 may be arranged at any position on the interlayer insulation layer 105 except for a position at which the second via 1000 is arranged to electrically connect the anode of the organic light-emitting diode 103 to the drain electrode of the thin-film transistor 102. As shown in FIGS. 4B and 4C, an orthographic projection of the fan-out trace 1050 on the base substrate 101 overlaps with that of the organic luminescent layer on the base substrate 10. Nonetheless, the foregoing only described some pixel units in the display panel.

As shown in FIG. 5C, the irregularly-shaped display panel, that is, the heart-shaped display panel, includes a plurality of pixel units arranged in a plurality of rows and columns. Respective numbers of pixel units in the plurality of rows of pixel units are different from one another along a column direction. In the embodiment shown in FIG. 5C, the plurality of fan-out traces 1050 are arranged in the display region AA of the display panel, the plurality of fan-out traces 1050 correspond to the plurality of data lines in the display panel, respectively, and each data line is connected to the driving chip in a bonding region outside the display region AA through its corresponding fan-out trace 1050. Since a side of the heart-shaped display panel away from the bonding region is relatively wide, positions at which the plurality of data lines and the plurality of fan-out traces 1050 are to be electrically connected to one another may be arranged at this wider side of the display panel. As shown in FIGS. 5A and 5C, a plurality of vias may be arranged on a side of the display region AA distal to the bonding region so as to electrically connect the plurality of fan-out traces to the plurality of data lines, respectively.

It is to be noted that, as shown in FIGS. 4A to 4C, the interlayer insulation layer 105 is arranged on the side of the layer where the data line is situated away from the base substrate 101, and the fan-out trace 104 is arranged on the side of the interlayer insulation layer 105 away from the base substrate 101, such that the interlayer insulation layer 105 can provide insulation between the data line and the fan-out trace 104 to prevent a short circuit there-between, and the fan-out trace 104 and the data line can be arranged in different layers to prevent the data line from affecting the wiring of the fan-out trace 104; therefore, in the display region, the data line can be drawn out by the fan-out trace 104, and an area occupied by all the fan-out traces 104 can be reduced by controlling the spacing between adjacent fan-out traces 104 in the display region, such that the fan-out traces 104, when being drawn to the external driving chip, just need a relatively small frame to accommodate them. The fan-out trace 104 may be connected to the data line through the first via penetrating through the interlayer insulation layer 105 to provide a driving signal to the light-emitting device 103, such that the light-emitting device 103 emits light to realize the display function.

FIGS. 4A to 4C only show examples of how to arrange a fan-out trace 104 or 1050 in the display region AA. However, as can be seen from FIG. 5C, the arrangement of the fan-out trace 104 or 1050 varies depending on the pixel units. In a wider part of the heart-shaped display panel, that is, a side of the heart-shaped display panel away from the bonding region, the fan-out traces 1050 may be arranged to extend along a same direction as the data lines extend, and in such case, a fan-out trace 1050 in each pixel region is arranged below the organic luminescent layer; and in a narrower part of the heart-shaped display panel, that is, a side of the heart-shaped display panel close to the bonding region, the fan-out traces 1050 may be arranged more densely, that is, the spacing between adjacent fan-out traces 1050 becomes narrow, and in such case, it is necessary to adjust a position of a fan-out 1050 in each pixel region. Therefore, the data lines and the fan-out traces 1050 may be electrically connected through the first vias 1060 on the side of the heart-shaped display panel away from the bonding region. In the present disclosure, the fan-out traces 104 or 1050 may be regarded as being arranged in a same layer as the second vias 1000 through which the anodes of the organic light-emitting diodes are electrically connected to the drain electrodes of the thin-film transistors, and there-fore, during the arrangement of the fan-out traces 104 or 1050 for the irregularly-shaped display panel, it is only necessary for them to avoid the second vias 1000, as shown in FIG. 5C.

Figure 6:
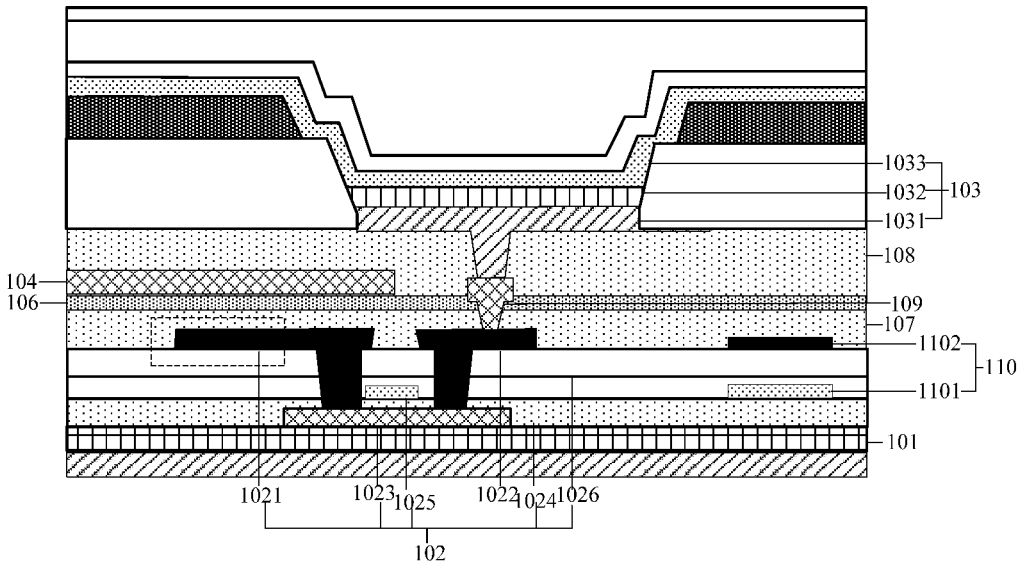
FIG. 6 is a schematic view of a structure of another display substrate provided in some embodiments of the present disclosure.

In some embodiments, as shown in FIG. 6, the data line and a source electrode 1021 and a drain electrode 1022 of the thin-film transistor 102 are arranged in a same layer; a passivation layer 106, a first planarization layer 107 and a second planarization layer 108 are successively arranged on a side of the data line away from the base substrate 101; and a transfer electrode 109 is arranged between the first pla-narization layer 107 and the second planarization layer 108, wherein the transfer electrode 109 is connected to the drain electrode 1022 of the thin-film transistor 102 through the second via penetrating through the passivation layer 106 and the first planarization layer 107, an anode 1031 of the light-emitting device 103 is connected to the transfer elec-trode 109 through the third via penetrating through the second planarization layer 108, and the fan-out trace 104 and the transfer electrode 109 are arranged in a same layer and made of a same material.

It is to be noted that, as shown in FIG. 6, the thin-film transistor 102 may include an active layer 1023, a gate insulation layer 1024, a gate electrode 1025, an insulation layer 1026, the source electrode 1021 and the drain electrode 1022 successively arranged on the base substrate 101, wherein the source electrode 1021 and the drain electrode 1022 are arranged in a same layer and are connected to two ends of the active layer 102 through vias penetrating through the insulation layer 1026, respectively. It is to be understood that the thin-film transistor 102 in the display substrate provided in embodiments of the present disclosure may be a top-gate thin-film transistor or a bottom-gate thin-film transistor, and is not limited herein. The passivation layer 106 may be arranged on the source electrode 1021 and the drain electrode 1022, which can prevent water, oxygen and the like from infiltrating from the outside into the source electrode 1021 and the drain electrode 1022 of the thin-film transistor 102 and other conductive film layers and damag-ing the thin-film transistor, and therefore protect the thin-film transistor 102. The first planarization layer 107 may make the source electrode 1021 and the drain electrode 1022 of the thin-film transistor 102 flat, thereby enabling these electrodes to adhere to other film layer on top of them and protect them. The second planarization layer 108 may make the transfer electrode 109 flat, thereby enabling this elec-trode to adhere to other film layer on top of it. Meanwhile, the first planarization layer 107 and the second planarization layer 108 may be prepared as relatively thick film layers, for example, respective thicknesses of the first planarization layer 107 and the second planarization layer 109 may be 2 micrometers or more, whereby the first planarization layer 107 and the second planarization layer 108 can effectively reduce resistor-capacitor (RC) loading on the film layer where the source electrode 1021 and the drain electrode 1022 are situated and on the film layer where the fan-out trace 104 is situated and therefore reduce the RC loading on the entire metal conductive wire (constituted by the fan-out trace 104 and the data line), thereby reducing power consumption of the wiring in the display substrate and saving power. The transfer electrode 109 and the anode 1031 of the organic light-emitting device 103 may form a double-layered structure in parallel connection, which can reduce resistance resulting from the connection to save power. The light-emitting device 103 includes the anode 1031, an organic functional layer 1032 and a cathode 1033 successively arranged on the second planarization layer 108. The organic functional layer 1032 may include a hole injection layer, a hole transport layer, an organic luminescent layer, an electron transport layer, an electron injection layer and the like. The organic functional layer 1032 is driven by a voltage between the anode 1031 and the cathode 1033 to emit light to realize the display function. A material of the anode 1031 may include metal oxides such as indium tin oxide (ITO), indium zinc oxide (IZO) and the like, or metals such as silver (Ag), aluminum (Al), molybdenum (Mo) and the like or their alloys. A material of the cathode 1033 may include metals such as magnesium (Mg), calcium (Ca), lithium (Li), aluminum (Al) and the like or their alloys, or metal oxides such as indium zinc oxide (IZO), zinc tin oxide (ZTO) and the like, or organic conductive materials such as poly(3,4-ethylenedioxythiophene):polystyrene sulfonate (PEDOT: PSS) and the like. The display substrate may further include a pixel definition layer to define a position at which the light-emitting device 103 is formed, and an encapsulation layer arranged on the cathode 1033 of the light-emitting device 103. The encapsulation layer may be of a single-layered structure or a multi-layered structure. For example, the encapsulation layer includes a first inorganic encapsulation layer, an organic encapsulation layer and a second inorganic encapsulation layer. The encapsulation layer may encapsulate the light-emitting device 103 and protect it by preventing water, oxygen and the like from infiltrating into its various film layers. The fan-out trace 104 and the transfer electrode 109 may be arranged in a same layer and made of a same material. In embodiments of the present disclosure, two or more functional layers being arranged in a same layer means that these functional layers arranged in the same layer may be made out of a same material layer and formed by a same manufacturing process (e.g., a patterning process or the like), thereby simplifying a manufacturing process of the display substrate. It is to be understood that a passivation layer may be further arranged between the fan-out trace 104 and the second planarization layer 108, and the passivation layer may protect the film layer where the fan-out trace 104 is situated and prevent water, oxygen and the like from infiltrating into and damaging the film layer. In practical applications, the display substrate may further include a barrier layer and a buffer layer, the barrier layer may prevent impurities such as water, oxygen and the like from infiltrating from the base substrate 101 into functional structures such as the thin-film transistor 102 and the like, and the buffer layer may provide a flat surface to facilitate arrangement of other functional layers of the display substrate. The barrier layer and the buffer layer together can protect the other functional structures on the base substrate 101.

In some embodiments, as shown in FIG. 5B, each fan-out trace 104 includes a first sub-connection line 1041, a second sub-connection line 1042 and a third sub-connection line 1043 electrically connected to one another, wherein all the third sub-connection lines 1043 are arranged side by side in a middle region of the display region; a first end of each first sub-connection line 1041 is connected to a data line corresponding to the first sub-connection line 1041, and a second end thereof is connected to a first end of a second sub-connection line 1042 corresponding thereto; a first end of each second sub-connection line 1042 is connected to a second end of a first sub-connection line 1041 corresponding to the second sub-connection line 1041, and a second end thereof is connected to a first end of a third sub-connection line 1043 corresponding thereto; and a spacing between adjacent third sub-connection lines 1043 is smaller than that between adjacent first sub-connection lines 1041.

It is to be noted that in the display region, the fan-out trace 104 may be divided into three sections, namely, the first sub-connection line 1041, the second sub-connection line 1042 and the third sub-connection line 1043 electrically connected to one another; the first end of the first sub-connection line 1041 may be directly connected to the data line corresponding thereto through a via, the first sub-connection line 1041 may extend along a direction toward the second sub-connection line 1042 corresponding thereto to be connected to the second sub-connection line 1042, and the first end of the third sub-connection line 1043 is connected to the second sub-connection line 1042 corresponding thereto, whereby the first sub-connection line 1041 is connected to the third sub-connection line 1042 through the second sub-connection line 1043; all the third sub-connection lines 1043 are arranged side by side at a middle position in the display region, the spacing between adjacent third sub-connection lines 1043 is smaller than that between adjacent first sub-connection lines 1041, and an area occupied by all the third sub-connection lines 1043 may be controlled by reducing the spacing between adjacent third sub-connection lines 1043, such that the fan-out traces 104 as a whole, when being connected to the external driving chip, just need a relatively small frame (the region outside the heart shape as shown in FIG. 5B) of the display substrate to accommodate them, which can make the frame of the display substrate more compact and therefore increase the screen-to-body ratio and improve the display effects. In practical applications, a line joining points at which the first sub-connection lines 1041 and the second sub-connection lines 1042 are connected to one another exhibits a monotonically increasing pattern from either side of the line to a middle thereof, whereby the spacing between adjacent second sub-connection lines 1042 can be increased and cross talk between signals transmitted by them can be prevented so as to facilitate the wiring of the fan-out traces 104 as a whole.

In some embodiments, as shown in FIG. 5C, each fan-out trace 105 may be divided into three sections, namely, a first sub-connection line 1051, a second sub-connection line 1052 and a third sub-connection line 1053 electrically connected to one another; a first end of each first sub-connection line 1051 may be directly connected to a data line corresponding thereto through a first via 1060, and the first sub-connection line 1051 may extend along a direction toward a second sub-connection line 1052 corresponding thereto to be connected to the second sub-connection line 1052, and a first end of a third sub-connection line 1053 is connected to the second sub-connection line 1052 corresponding thereto, whereby the first sub-connection line 1051 is connected to the third sub-connection line 1052 through the second sub-connection line 1053; all the third sub-connection lines 1053 are arranged side by side at a middle position in the display region, the spacing between adjacent third sub-connection lines 1053 is smaller than that between adjacent first sub-connection lines 1051, and an area occupied by all the third sub-connection lines 1053 may be controlled by reducing the spacing between adjacent third sub-connection lines 1053, such that the fan-out traces 105 as a whole, when being connected to the external driving chip, just need a relatively small frame of the display substrate (the region outside the heart shape as shown in FIG. 5B) to accommodate them, which can make the frame of the display substrate more compact and therefore increase the screen-to-body ratio and improve the display effects. In practical applications, respective included angles between the first sub-connection line 1051 and the second sub-connection line 1052 and between the second sub-connection line 1052 and the third sub-connection line 1053 are around 80 to 100 degrees, for example, 90 degrees, whereby the spacing between adjacent second sub-connection lines 1052 can be increased and cross talk between signals transmitted by them can be prevented so as to facilitate the wiring of the fan-out traces 1050 as a whole.

In some embodiments, a direction along which the third sub-connection lines 1043 or 1053 extend is the same as a direction along which the date lines extend.

It is to be noted that in the display region of the display substrate, the gate lines are typically arranged in a row direction, and the data lines are typically arranged in a column direction; a gate signal is inputted by each gate line to light-emitting devices 103 in a corresponding row of pixel units such that the light-emitting devices 103 in this row of pixel units are turned on, and at the same time, a data signal is inputted by each data line to light-emitting devices 103 in a corresponding column of pixel unit, whereby one row of light-emitting devices 103 is lighted after another to realize the display function. A direction along which the third sub-connection lines 1043 of the fan-out traces 104 extend may be the same as the direction along which the date lines extend, such that the fan-out traces as a whole are drawn to an end of the display substrate and connected to the external driving chip, and the third sub-connection lines 1043 just need a relatively small frame of the display structure to accommodate them, which can make the frame of the display substrate more compact and therefore increase the screen-to-body ratio and improve the display effects.

In some embodiments, as shown in FIGS. 4A and 6, the pixel unit further includes a storage capacitor 110; a first plate 1101 of the storage capacitor 110 and the gate electrode 1025 of the thin-film transistor 102 are arranged in a same layer and made of a same material; and a second plate 1102 of the storage capacitor 110 and the source electrode 1021 and the drain electrode 1022 of the thin-film transistor 102 are arranged in a same layer and made of a same material.

It is to be noted that in practical applications, as shown in FIGS. 4A and 6, the pixel unit further includes the storage capacitor 110 for storing voltage; the first plate 1101 of the storage capacitor 110 and the gate electrode 1025 of the thin-film transistor 102 may be arranged in the same layer and made of the same material; and the second plate 1102 of the storage capacitor 110 and the source electrode 1021 and the drain electrode 1022 of the thin-film transistor 102 may be arranged in the same layer and made of the same material; and in embodiments of the present disclosure, two or more functional layers being arranged in a same layer means that these functional layers arranged in the same layer may be made out of a same material layer and formed by a same manufacturing process (e.g., a patterning process or the like), thereby simplifying a manufacturing process of the display substrate. It is to be understood that either of the two plates of the storage capacitor 110 may be arranged in a same layer as other conductive layer, or may be separately arranged on an insulation layer. For example, the first plate 1101 of the storage capacitor 110 and the gate electrode 1025 of the thin-film transistor 102 may be arranged in the same layer and made of the same material, and the second plate 1102 may be situated between the gate insulation layer 1024 and the insulation layer 1026. Respective positions of the two plates of the storage capacitor may be configured as appropriate according to practical needs.

In some embodiments, as shown in FIGS. 4B and 4C, the pixel unit further includes a storage capacitor 110; a first plate 1101 of the storage capacitor 110 and the gate electrode 1025 of the thin-film transistor 102 are arranged in a same layer and made of a same material; and a second plate 1102 of the storage capacitor 110 and a metal layer arranged on the gate insulation layer on top of the gate electrode of the thin-film transistor 102 are arranged in a same layer and made of a same material.

In some embodiments, respective numbers of pixel units in at least some rows in the display substrate are different from one another.

It is to be noted that embodiments of the present disclosure are directed to a display structure which may be a regularly-shaped display substrate or an irregularly-shaped display substrate, and especially, to an irregularly-shaped display substrate with irregular edges, for example, the heart-shaped display substrate shown in FIGS. 5B and 5C. Respective numbers of pixel units in at least some rows in the display substrate are different from one another. For example, in the heart-shaped display substrate shown in FIGS. 5B and 5C, rows close to a middle row have a relatively large number of pixel units, whereas rows close to a bottom row have a relatively small number of pixel units.

In some embodiments, the display substrate has a bonding region connected to a side of the display region; the number of pixel units in each row decreases along a direction close to the bonding region.

It is to be noted that the bonding region of the display substrate corresponds to the region outside the heart shape shown in FIGS. 5B and 5C, a first pad connected to an end of a second sub-connection line 1042 of each fan-out trace 104 is arranged in the bonding region, and a second pad is arranged on the external driving chip, and the first pad and the second pad may be connected by bonding to each other, which can enable the external driving chip to provide a data signal to a light-emitting device in each pixel unit through the corresponding fan-out trace 104 and data line to control a brightness of the light-emitting device in the pixel unit, thereby realizing the display of multiple colors. As shown in FIGS. 5B and 5C, the number of pixel units in each row decreases along a direction close to the bonding region, thereby forming the heart-shaped display substrate.

Some embodiments of the present disclosure provide a display apparatus, including the display substrate provided in the foregoing embodiments; and specifically, the display apparatus may be a cell phone, a tablet computer, a smart television or any other terminal apparatus having an irregular shape. The display apparatus may be implemented using the same principles as those used for implementing the display substrate provided in the foregoing embodiments, which will not be repeated herein.

In some embodiments, the display apparatus further includes a driving chip, which is situated on a side of the base substrate 101 away from the pixel units and connected to the fan-out traces 104 or 1050 in the bonding region.

It is to be noted that the driving chip may be connected to the fan-out traces 104 or 1050 by bonding to each other, and provide a data signal to a light-emitting device in each pixel unit through the corresponding fan-out trace 104 and data line to control a brightness of the light-emitting device in the pixel unit, thereby realizing the display of multiple colors. In practical applications, the driving chip is typically folded to the side of the base substrate 101 away from the pixel units, that is, a back of the display apparatus; such that the driving chip does not need to occupy a frame of the display apparatus so as to realize full-screen display effects. Signals outputted by the driving chip may be transmitted by the fan-out traces 104 or 1050 across the heart-shaped display region to a top of the display region, and then transmitted by the data lines to the pixel units in the display region, whereby signal paths of the driving chip can be kept in a same order as that of signal paths of a driving chip in the related art, which does not require changing a structure of the driving chip and therefore saves research and design costs of the driving chip, and whereby the order of the signal paths of the driving chip can be made to correspond to that of the pixel units in the display region (that is, an order in which the pixel units are driven from left and right as shown in FIGS. 5B and 5C).

It is to be understood that the foregoing embodiments are merely exemplary embodiments for the purpose of illustrating the principle of the present disclosure, and the present disclosure is not limited thereto. Various modifications and improvements can be made by a person skilled in the art without departing from the spirit and essence of the present disclosure. Accordingly, all of the modifications and improvements also fall into the protection scope of the present disclosure.

The invention claimed is:

1. A display substrate, having a display region, the display substrate comprising: a base substrate, and a plurality of gate lines and a plurality of data lines on the base substrate; the plurality of gate lines and the plurality of data lines on the base substrate being arranged to cross each other to define a plurality of pixel regions, and a plurality of pixel units being arranged in the plurality of pixel regions, respectively; and each pixel unit of the plurality of pixel units comprising a thin-film transistor and a light-emitting device in the display region, wherein the display substrate further comprises a plurality of fan-out traces in the display region; and each fan-out trace of the plurality of fan-out traces is, at a top of the display region, electrically connected to a data line corresponding thereto, and the plurality of fan-out traces are arranged in a different layer from the plurality of data lines and the plurality of gate lines, and the display substrate further comprises a bonding region on a first side of the display region, each fan-out trace of the plurality of fan-out traces comprises a first sub-connection line, a second sub-connection line and a third sub-connection line which are electrically connected in sequence, a first end of a first sub-connection line of each fan-out trace of the plurality of fan-out traces is directly electrically connected to a data line corresponding to the first sub-connection line through a first via at the top of the display region and in a middle region in the display region, and a second end of the first sub-connection line is connected to a first end of a second sub-connection line corresponding to the first sub-connection line; a second end of the second sub-connection line is connected to a first end of a third sub-connection line corresponding to the second sub-connection line; the respective first sub-connection lines of the plurality of fan-out traces are arranged side by side in a middle region in the display region;

respective first sub-connection lines of the plurality of fan-out traces are away from the bonding region relative to respective second sub-connection lines of the plurality of fan-out traces;

a spacing between two adjacent third sub-connection lines, among respective third sub-connection lines of the plurality of fan-out traces, is smaller than a spacing between two adjacent first sub-connection lines; and a direction along which the respective third sub-connection lines and/or the respective first sub-connection lines of the plurality of fan-out traces extend in the different layer from the plurality of data lines and the plurality of gate lines is identical to a direction along which the plurality of data lines extend, and the first via is arranged at a second side of the display region, and the second side and the first side of the display region are two opposite sides along a direction that the plurality of data lines extend in a layer different from the plurality of fan-out traces.

2. The display substrate according to claim 1, further comprising an interlayer insulation layer on a side of a layer where the plurality of data lines are situated away from the base substrate, wherein the plurality of fan-out traces are situated on a side of the interlayer insulation layer away from the plurality of data lines; and each fan-out trace of the plurality of fan-out traces is connected to the data line corresponding to the fan-out trace through the first via penetrating through the interlayer insulation layer.

3. The display substrate according to claim 2, wherein the data line and a source electrode and a drain electrode of the thin-film transistor are arranged in a same layer; and the display substrate further comprises a passivation layer, a first planarization layer and a second planarization layer successively arranged on a side of the data line away from the base substrate, and a transfer electrode arranged between the first planarization layer and the second planarization layer, wherein the transfer electrode is connected to the drain electrode of the thin-film transistor through a second via penetrating through the passivation layer and the first planarization layer; a first electrode of the light-emitting device is connected to the transfer electrode through a third via penetrating through the second planarization layer; and the fan-out trace and the transfer electrode are insulated from each other, arranged in a same layer and made of a same material.

4. The display substrate according to claim 1, wherein the data line and a source electrode and a drain electrode of the thin-film transistor are arranged in a same layer; and the display substrate further comprises a passivation layer, a first planarization layer and a second planarization layer successively arranged on a side of the data line away from the base substrate, and a transfer electrode arranged between the first planarization layer and the second planarization layer, wherein the transfer electrode is connected to the drain electrode of the thin-film transistor through a second via penetrating through the passivation layer and the first planarization layer; a first electrode of the light-emitting device is connected to the transfer electrode through a third via penetrating through the second planarization layer; and the fan-out trace and the transfer electrode are insulated from each other, arranged in a same layer and made of a same material.

5. The display substrate according to claim 1, wherein
the light-emitting device in each pixel region comprises
an organic light-emitting diode which has a first elec-
trode, a second electrode and an organic luminescent
layer between the first electrode and the second elec-
trode;

the organic light-emitting diode is situated on a side of the
plurality of fan-out traces distal to the base substrate;
and the direction along which the respective third sub-con-
nection lines of the plurality of fan-out traces extend is
identical to the direction along which the plurality of
data lines extend, each third sub-connection line is
situated on a side of a data line corresponding to the
third sub-connection line distal to the base substrate
and is also situated on a side of an organic luminescent
layer corresponding to the third sub-connection line
close to the base substrate, and an orthographic projection of the third sub-connection
line on the base substrate falls within a range of an
orthographic projection of an organic light-emitting
diode corresponding to the third sub-connection line on
the base substrate.

6. The display substrate according to claim 5, wherein an
included angle between the second sub-connection line and
the first sub-connection line and/or an included angle
between the second sub-connection line and the third sub-
connection line range from 80 degrees to 100 degrees.

7. The display substrate according to claim 1, wherein an
included angle between the second sub-connection line and
the first sub-connection line and/or an included angle
between the second sub-connection line and the third sub-
connection line range from 80 degrees to 100 degrees.

8. The display substrate according to claim 1, wherein the
pixel unit further comprises a storage capacitor; a first plate of the storage capacitor and the gate electrode of the
thin-film transistor are arranged in a same layer and made of
a same material; and a second plate of the storage capacitor
and the source electrode and the drain electrode of the
thin-film transistor are arranged in a same layer and made of
a same material.

9. The display substrate according to claim 1, wherein the
pixel unit further comprises a storage capacitor; a first plate
of the storage capacitor and the gate electrode of the
thin-film transistor are arranged in a same layer and made of
a same material; and a second plate of the storage capacitor
and a metal layer arranged on a gate insulation layer on top
of the gate electrode of the thin-film transistor are arranged
in a same layer and made of a same material.

10. The display substrate according to claim 1, wherein
the plurality of pixel units comprise a plurality of pixel units
arranged in a plurality of rows and columns, and respective numbers of pixel units in at least some rows of
pixel units, among the plurality of pixel units arranged
in the plurality of rows and columns, are different from
one another.

11. The display substrate according to claim 10, wherein
numbers of pixel units in the rows of pixel units decrease
along a direction close to the bonding region.

12. A display apparatus, comprising the display substrate
according to claim 1.

13. The display apparatus according to claim 12, further
comprising a driving chip;

wherein the driving chip is on the side of the base
substrate away from the plurality of pixel units and
electrically connected to the plurality of fan-out traces
in the bonding region.

* * * * *